US006806472B2

(12) United States Patent
Yoon et al.

(10) Patent No.: US 6,806,472 B2
(45) Date of Patent: Oct. 19, 2004

(54) SWITCHING DEVICE OF AN X-RAY SENSOR AND METHOD FOR MANUFACTURING THE SAME

(75) Inventors: Jung-Kee Yoon, Uiwang-Si (KR); Chang-Won Kim, Seoul (KR)

(73) Assignee: DRTech Co., Ltd., Chungchyungbook-Do (KR)

( * ) Notice: Subject to any disclaimer, the term of this patent is extended or adjusted under 35 U.S.C. 154(b) by 304 days.

(21) Appl. No.: 09/988,359

(22) Filed: Nov. 19, 2001

(65) Prior Publication Data

US 2003/0010922 A1 Jan. 16, 2003

(30) Foreign Application Priority Data

Jul. 12, 2001 (KR) .................................... 2001-0042124

(51) Int. Cl.[7] .............................................. G01T 1/20
(52) U.S. Cl. ................................................ 250/370.09
(58) Field of Search .................................. 250/370.09

(56) References Cited

U.S. PATENT DOCUMENTS 6,399,962 B1 * 6/2002 Kim ............................. 357/72

FOREIGN PATENT DOCUMENTS

JP          61-3118 A   *  1/1986  ........... G02F/1/133

* cited by examiner

Primary Examiner—Constantine Hannaher
(74) Attorney, Agent, or Firm—McGuireWoods LLP

(57) ABSTRACT

A structure which prevents the distortion of the TFT characteristics caused by an electric charge formed on the surface of a protecting layer which exists on the TFT and a method for manufacturing the TFT. A switching device of an X-ray sensor comprises a TFT provided on a transparent substrate, a first protecting insulation layer which covers the TFT, storage capacity electrodes connected to a ground wire on the first protecting insulation layer, a second protecting insulation layer which covers the storage capacity electrode formed on the first protecting insulation layer, and a pixel electrode connected to one terminal of the TFT on the second protecting insulation layer, at least one portion of the storage capacity electrodes shielding the TFT region.

7 Claims, 5 Drawing Sheets

SWITCHING DEVICE OF AN X-RAY SENSOR AND METHOD FOR MANUFACTURING THE SAME

BACKGROUND OF THE INVENTION

1. Field of the Invention

The present invention relates to a structure of a switching device used in a digital X-ray imaging panel used in showing an X-ray image which penetrates a human body, and more particularly to a structure which prevents the distortion of the TFT characteristics caused by an electric field formed on the surface of a protecting layer which exists on the TFT and a method for manufacturing the TFT.

2. Description of the Prior Art

Generally, a digital X-ray imaging device uses a panel in which TFT arrays are formed.

U.S. Pat. No. 5,895,936 discloses a TFT structure formed in a TFT array panel used in an X-ray imaging device.

The TFT structure of the known technology is explained in a top view of FIG. 1 and a cross-sectional view which is taken along the line A-A' of FIG. 1.

The TFT 12 formed on a transparent substrate 1 comprises a gate electrode 3, a semiconductor layer 5 which is formed by interposing a gate insulation layer 4 on the gate electrode and has an island shape, and a source electrode 6a and a drain electrode 6b which are formed on the regions of both ends of the semiconductor layer.

A pixel electrode 7 is connected to a drain electrode 6b of the TFT, and a first protecting insulation layer 8 is interposed on the pixel electrode to form an additional pixel electrode 9b.

A contact hole is formed in the first protecting insulation layer 8, and a connecting terminal integrally formed with the additional pixel electrode 9b electrically makes contact with a pixel electrode.

Especially, the additional pixel electrode 9b has a ring shape along the edge portion of the pixel electrode 7 as shown by the hatched region of FIG. 1, and a portion of the additional pixel electrode 9b shields the TFT region.

A photoconductive layer 10 made of selenium and having a predetermined thickness is provided on the pixel electrode, and a common electrode 11 is provided on the photoconductive layer.

On the other hand, a storage capacity electrode 2 is provided at the lower portion of the pixel electrode, which is connected with ground wire (not illustrated).

The TFT 12 is covered with the additional pixel electrode 9b to exclude the influence caused to the TFT by a high electric field when high voltage is applied at the common electrode 11.

When a portion of the additional pixel electrode 9b connected to the pixel electrode 7 by interposing the first protecting insulation layer 8, an organic insulation layer such as BCB and acrylic which has a lower dielectric constant is used as the first protecting insulation to exclude the influence of the high electric field on the TFT.

However, in case the first protecting insulation layer 8 is formed with the organic insulation layer, since the property of adhesion between the organic insulation layer and the additional pixel electrode is not good. As a result, the separation of the layer which constitutes the additional pixel electrode and the inferiority of pattern are generated and then the manufacturing yield rate is remarkably deteriorated.

SUMMARY OF THE INVENTION

The present invention has been made to solve the above-mentioned problem, and accordingly it is an object of the present invention to provide a structure which prevents the distortion of the TFT characteristics caused by high electric field formed on the surface of a protecting layer which exists on the TFT and a method for manufacturing the TFT.

In order to achieve the object of the present invention, the present invention provides a switching device of an X-ray sensor which comprises a TFT provided on a transparent substrate, a first protecting insulation layer which covers the TFT, storage capacity electrodes connected to a ground wire at a lower portion of the first protecting insulation layer, a second protecting insulation layer which covers the storage capacity electrode formed on the first protecting insulation layer, and a pixel electrode connected to one terminal of the TFT on the second protecting insulation layer, at least one portion of the storage capacity electrodes shielding the TFT region.

The ground wire is connected through a contact hole which is formed at a lower portion of the first protecting insulation layer and penetrates the first protecting insulation layer.

The pixel electrode is connected to one terminal of the TFT through a contact hole which penetrates the first protecting insulation layer and the second protecting insulation layer.

The first protecting insulation layer and the second protecting insulation layer are formed of an inorganic insulation layer.

BRIEF DESCRIPTION OF THE DRAWINGS

The above and other objects and advantages of the present invention will become readily apparent by reference to the following detailed description when considered in conjunction with the accompanying drawings wherein.

DETAILED DESCRIPTION OF THE PREFERRED EMBODIMENT

Hereinafter, the manufacturing method, the structure, and the operation of a TFT of an X-ray sensor according to the present invention will be explained in detail with reference to FIGS. 3 to 6.

Figure 1:
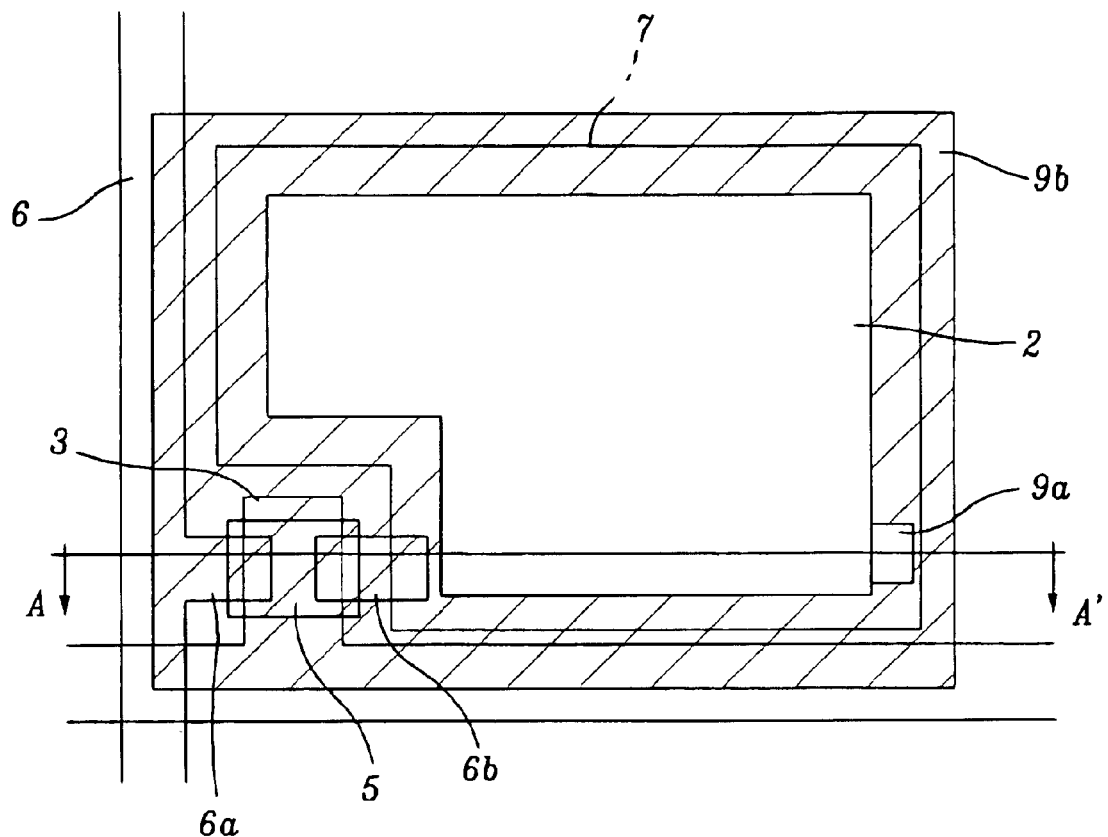
FIG. 1 is a top view of a TFT used as a switching device of a conventional X-ray sensor.
Figure 2:
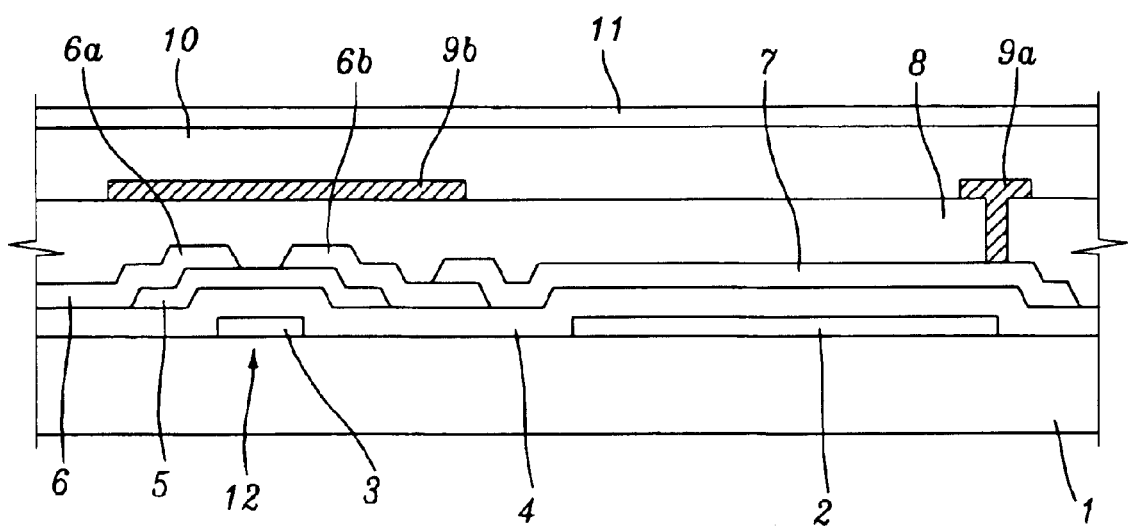
FIG. 2 is a cross-sectional view taken along a line A-A' of FIG. 1.
Figure 3:
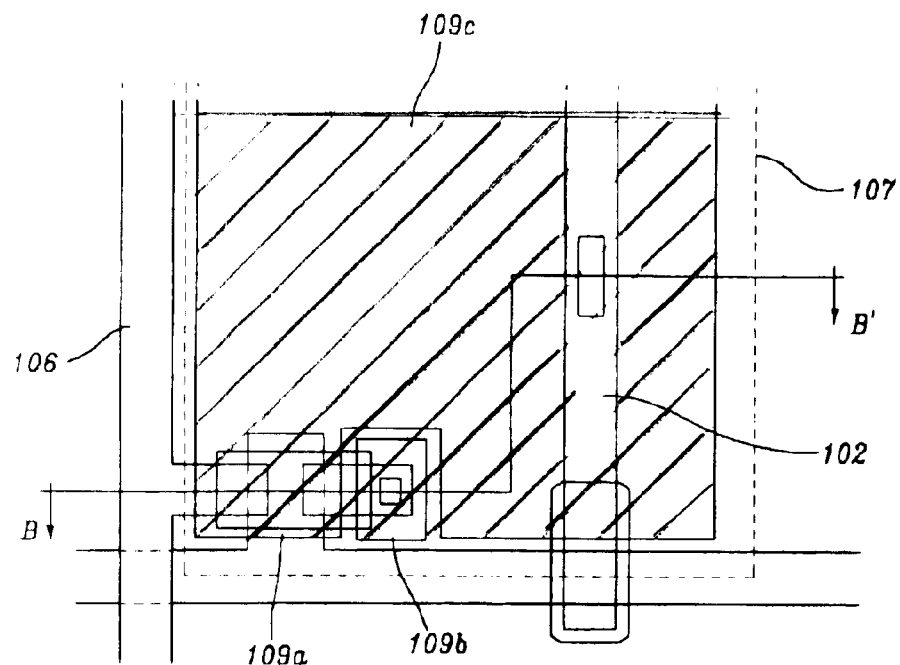
FIG. 3 is a top view of a TFT used as a switching device for an X-ray sensor according to the present invention.
Figure 4:
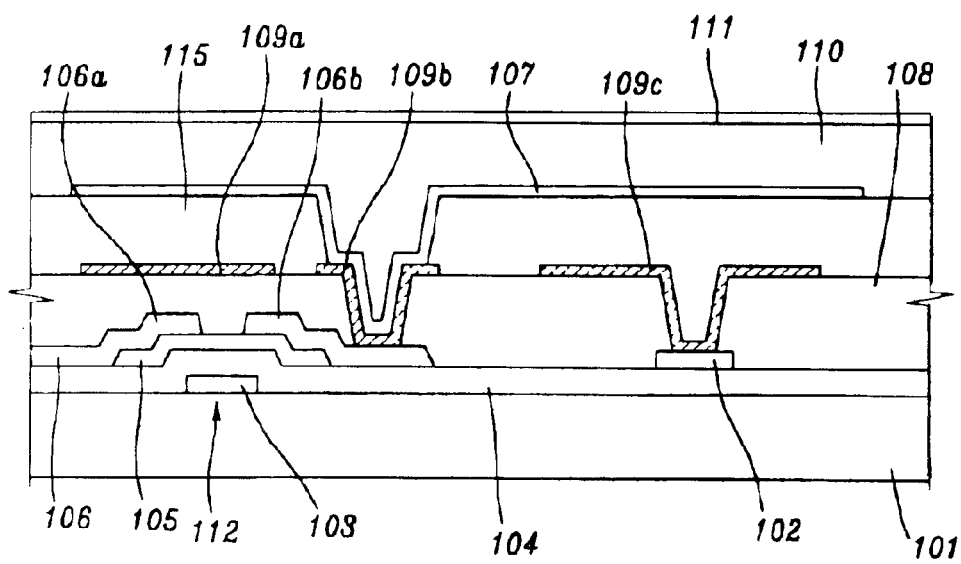
FIG. 4 is a cross-sectional view taken along a line B-B' of FIG. 4.
Figure 5A:
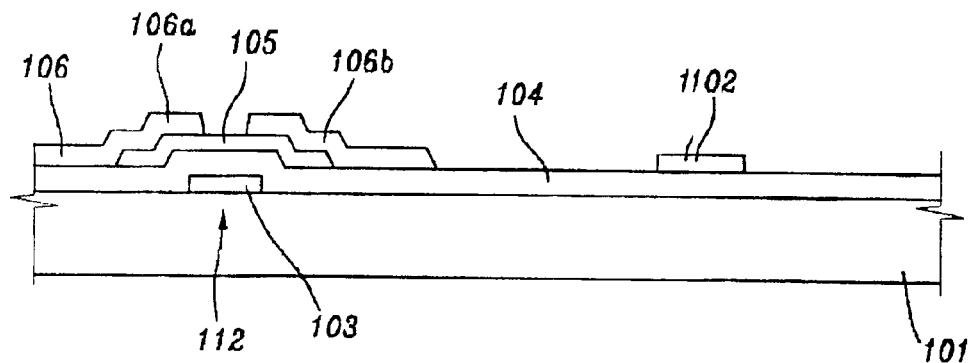
FIGS. 5a to 5c are process cross-sectional view for explaining a manufacturing process of the TFT of an X-ray sensor according to the present invention.
Figure 5B:
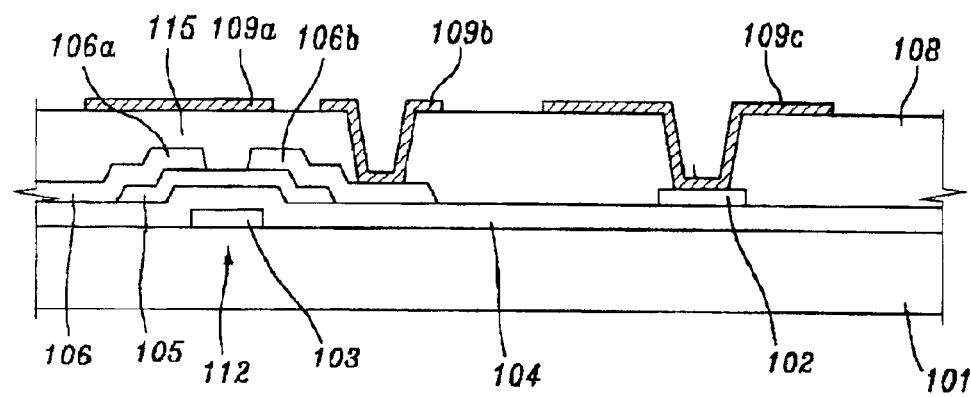

According to the manufacturing method of the TFT of the X-ray sensor of the present invention, a gate electrode 103 formed of metal layers such as Cr and Al is patterned on a transparent substrate 101 as shown in FIGS. 3 to 5. A gate insulation layer 104 formed of an inorganic insulation layer of SiNx, SiO2, and SiON is formed so as to cover the gate electrode 103. A semiconductor layer 105 for example amorphous Si layer so as to have an island shape is formed on a gate insulation layer of a gate electrode section. A source electrode 106a and a drain electrode 106b formed of for example Cr and/or Al metal layers are formed so as to be connected to both ends of the semiconductor layer. The source electrode and the drain electrode are formed by simultaneously patterning them when the pattern of a data bus line 106 is formed. A ground wire 102 is simultaneously patterned across the region in which a pixel electrode is formed. Therefore, the ground wire 102 is arranged on the gate insulation layer 104 so as to be parallel to the data bus line.

Thereafter, a first protecting insulation layer 108 formed of an inorganic insulation layer of SiNx, SiO2, and SiON is formed on a transparent substrate in which a switching device and a ground wire 102 formed of the TFT 112 is formed. A contact hole is formed on the first protecting insulation layer such that a drain electrode 106b of the TFT and a portion of the ground wire 102 are exposed. Storage capacity electrodes 109a and 109c are formed by patterning an ITO layer thereon. The storage capacity electrodes 109a and 109c are simultaneously formed, and the capacity electrode 109a should be patterned so as to shield the region of the TFT 112. The ITO layer 109b which makes contact with the drain electrode section of the TFT is patterned so as to be separated from the ITO which forms the capacity electrodes 109a and 109c, and functions as a connecting terminal of a pixel electrode 107.

Figure 5C:
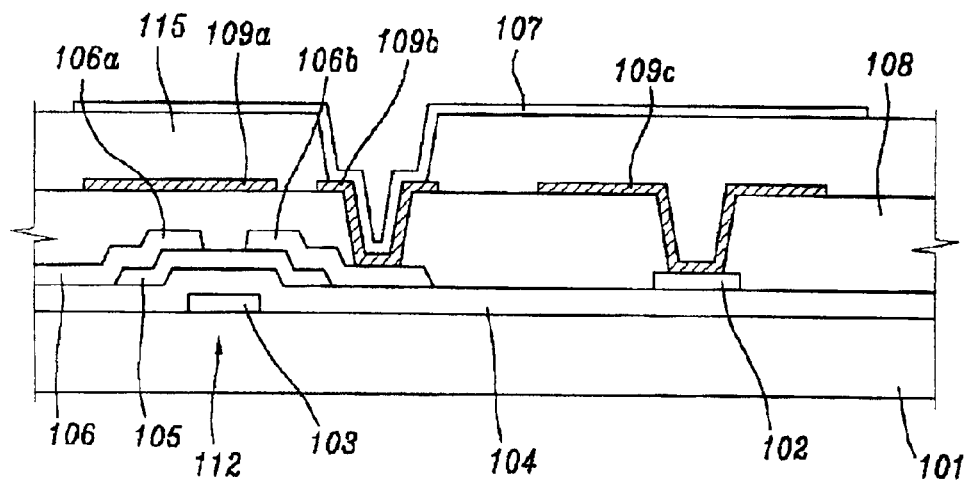

Thereafter, as shown in FIG. 5c, a second protecting insulation layer 115 formed of an inorganic insulation layer of SiNx, SiO2, and SiON is formed on a substrate in which the capacity electrodes 109a and 109c and the connecting terminal 109b of the pixel electrode are formed. A contact hole is formed in the second protecting insulation layer such that the connecting terminal 109b which makes contact with the drain electrode 106b of the TFT is exposed, and the ITO is patterned thereon to form a pixel electrode. Namely, a square shape of the pixel electrode 107 and the capacity electrodes 109a and 109c is formed by interposing the second protecting insulation layer, and the capacity electrode 109a connected to the ground wire 102 simultaneously shields the TFT region.

Figure 6A:
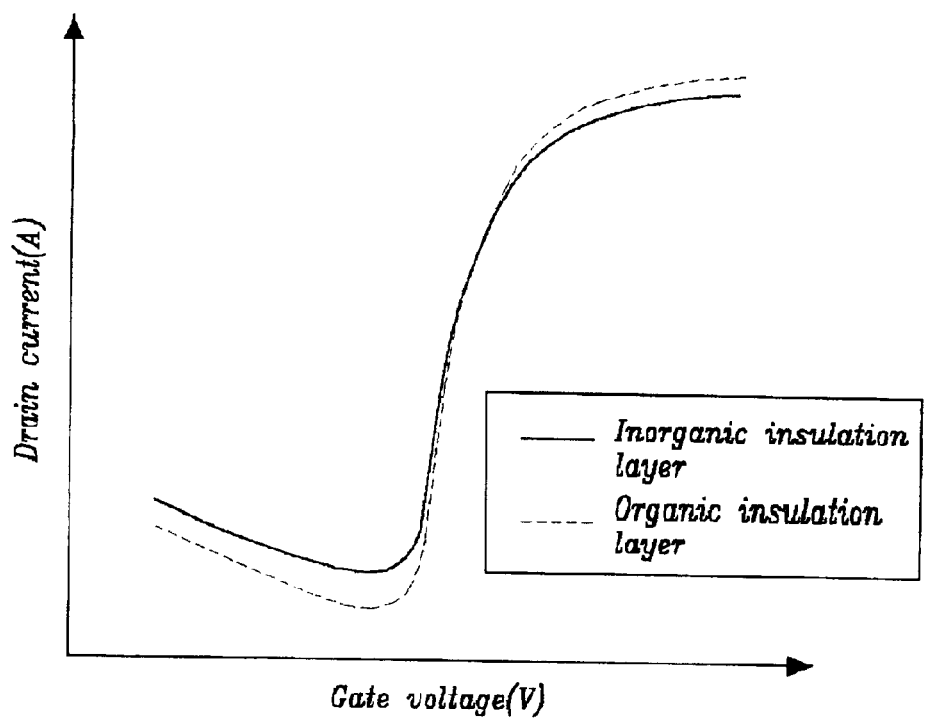
FIG. 6a is a graph for showing the transfer characteristics of a standard TFT.
Figure 6B:
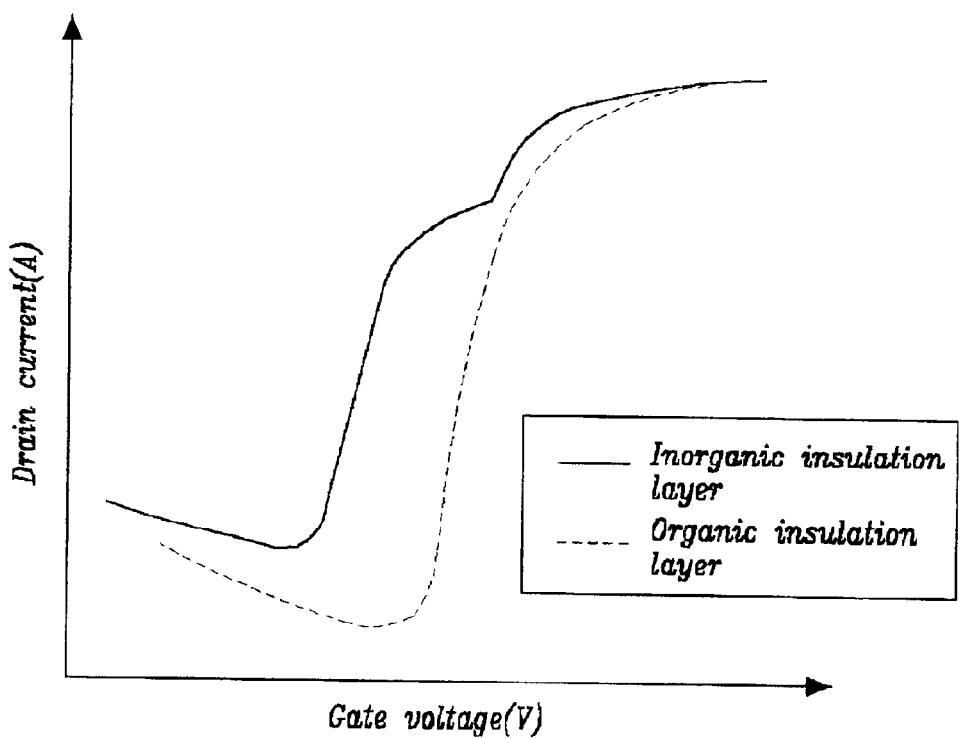
FIG. 6b is a graph for showing the transfer characteristics of a TFT in a structure which covers the TFT with a conventional pixel electrode.
Figure 6C:
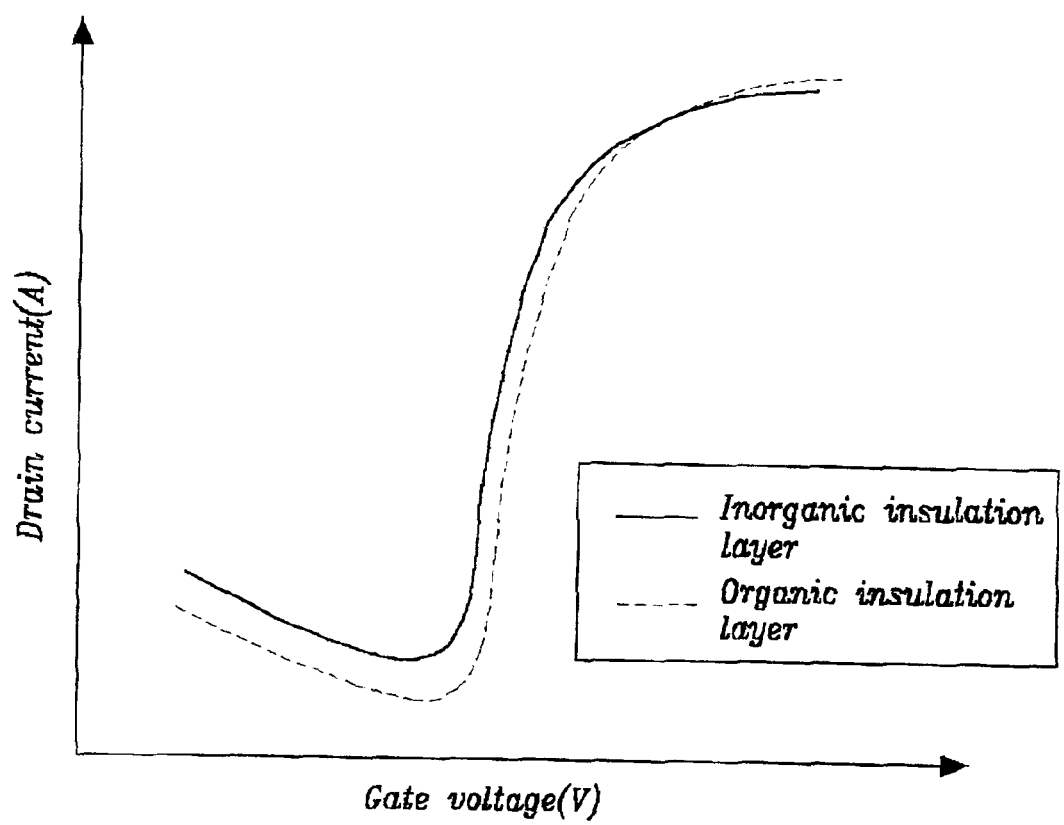
FIG. 6c is a graph for showing the transfer characteristics of the TFT according to the present invention.

According to the TFT and the pixel electrode having the above-mentioned structure, even if an inorganic insulation layer is used as the second protecting insulation layer instead of the organic insulation layer, the characteristics of the TFT is not distorted severely as shown in FIG. 6c and the merits of the inorganic insulation layer can be used in the TFT structure of the present invention.

Thereafter, a photoconductive layer 110 formed of selenium is formed on the substrate in which the pixel electrode 107 is formed as shown in FIG. 4 and a common electrode 111 is formed on the optical conductive layer.

The TFT transfer characteristics of the present invention are similar regardless of the protecting insulation layer which is the organic insulation layer or the inorganic insulation layer as shown in FIG. 6c, and has good graph characteristics compared with the ideal TFT transfer characteristics of FIG. 6a.

On the other hand, in the conventional TFT in which an inorganic insulation layer is used as the protecting insulation layer and the TFT is covered with the pixel electrode, the characteristics of the TFT are severely distorted compared with those of the TFT which uses the organic insulation layer as the protecting insulation layer.

According to the present invention, by interposing the first protecting insulation layer formed of the inorganic insulation layer, the storage capacity electrode 109a connected to the ground wire 102 shields the TFT region. Therefore, the TFT is effectively protected from the high electric field caused by the charge accumulation or by high voltage applied at the common electrode 11. Further, even when the voltage of the pixel electrode is raised, the voltage does not influence the TFT.

Further, since the first and the second insulating layer can be formed by an inorganic dielectric, the manufacturing yield rate of the TFT array is improved.

As stated above, a preferred embodiment of the present invention are shown and described. Although the preferred embodiment of the present invention has been described, it is understood that the present invention should not be limited to the preferred embodiment but various changes and modifications can be made by one skilled in the art within the spirit and scope of the present invention as hereinafter claimed.

What is claimed is:

1. A switching device of an X-ray sensor which comprises
   a thin film transistor (TFT) provided on a transparent substrate,
   a first protecting insulation layer which covers the TFT,
   storage capacity electrodes electrically isolated from a gate line and a terminal portion of the TFT, and connected to a ground wire formed on a gate insulating layer,
   a second protecting insulation layer which covers the storage capacity electrodes formed on the first protecting insulation layer, and
   a pixel electrode connected to one terminal of the TFT on the second protecting insulation layer,
   at least one portion of the storage capacity electrodes shielding the TFT.

2. A switching device according to claim 1, wherein the ground wire is connected by a contact hole which is formed at a lower portion of the first protecting insulation layer and penetrates the first protecting insulation layer.

3. A switching device according to claim 1, wherein the pixel electrode is connected to one terminal of the TFT through a contact hole which penetrates the first protecting insulation layer and the second protecting insulation layer.

4. A switching device according to claim 1, wherein the first protecting insulation layer and the second protecting insulation layer are formed of an inorganic insulation layer.

5. A method for manufacturing a switching device of an X-ray sensor which comprises the steps of:
   forming a TFT and a ground wire on a transparent substrate;
   forming a first protecting insulation layer which covers the TFT and the ground wire;
   forming a first contact hole on the ground wire section and patterning storage capacity electrodes connected to the ground wire on the first protecting insulation layer such that at least a portion of the storage capacity electrodes shields the TFT, and such that the storage capacity electrodes are electrically isolated from a gate line and a terminal portion of the TFT;
   forming a second protecting insulation layer on the first protecting insulation layer formed by patterning the storage capacity electrodes; and forming a second contact hole on one terminal portion of the TFT and forming a pixel electrode connected to one terminal of the TFT on the second protecting insulation layer.

6. A method according to claim 5, wherein the contact hole is formed such that a portion of one terminal of the TFT is simultaneously exposed when the first contact hole is formed and the pixel electrode makes contact with one terminal of the TFT through the contact hole and the second contact hole.

7. A method according to claim 5, wherein the first protecting insulation layer and the second protecting insulation layer are formed of an inorganic insulation.

* * * * *